United States Patent
Roig-Guitart et al.

(10) Patent No.: US 9,219,138 B2
(45) Date of Patent: Dec. 22, 2015

(54) SEMICONDUCTOR DEVICE HAVING LOCALIZED CHARGE BALANCE STRUCTURE AND METHOD

(71) Applicant: Semiconductor Components Industries, LLC, Phoenix, AZ (US)

(72) Inventors: Jaume Roig-Guitart, Oudenaarde (BE); Peter Moens, Zottegem (BE); Piet Vanmeerbeek, Sleidinge (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 10 days.

(21) Appl. No.: 14/025,587

(22) Filed: Sep. 12, 2013

(65) Prior Publication Data

US 2014/0097489 A1 Apr. 10, 2014

Related U.S. Application Data

(60) Provisional application No. 61/710,460, filed on Oct. 5, 2012.

(51) Int. Cl.
*H01L 29/732* (2006.01)
*H01L 29/78* (2006.01)
*H01L 29/66* (2006.01)
*H01L 29/06* (2006.01)
*H01L 29/08* (2006.01)
*H01L 29/739* (2006.01)
(Continued)

(52) U.S. Cl.
CPC ............ *H01L 29/78* (2013.01); *H01L 29/0623* (2013.01); *H01L 29/0634* (2013.01); *H01L 29/0646* (2013.01); *H01L 29/0873* (2013.01); *H01L 29/66477* (2013.01); *H01L 29/66712* (2013.01); *H01L 29/66734* (2013.01); *H01L 29/7397* (2013.01); *H01L 29/7802* (2013.01); *H01L 29/7813* (2013.01); *H01L 29/7827* (2013.01); *H01L 29/0649* (2013.01); *H01L 29/0878* (2013.01); *H01L 29/1095* (2013.01); *H01L 29/41766* (2013.01)

(58) Field of Classification Search
CPC ............ H01L 29/7801; H01L 29/7802; H01L 29/781; H01L 29/7813; H01L 29/7811
USPC .................. 257/330, 332, E29.027; 438/270
See application file for complete search history.

(56) References Cited

U.S. PATENT DOCUMENTS 5,572,048 A 11/1996 Sugawara
6,465,863 B1 10/2002 Deboy et al.
(Continued)

OTHER PUBLICATIONS

Syotaro Ono, et al., Design concept of n-buffer layer (n-Bottom Assist Layer) for 600V-class Semi-Super Junction MOSFET, Proceedings of the 19th International Symposium on Power Semiconductor Devices & ICs, May 27-30, 2007 Jeju, Korea.
(Continued)

*Primary Examiner* — Cheung Lee
*Assistant Examiner* — Stephen Bradley
(74) *Attorney, Agent, or Firm* — Kevin B. Jackson

(57) ABSTRACT

In one embodiment, a semiconductor device has a superjunction structure formed adjoining a low-doped n-type region. A low-doped p-type region is formed adjoining the superjunction structure above the low-doped n-type region and is configured to improve Eas characteristics. A body region is formed adjacent the low-doped p-type region and a control electrode structure is formed adjacent the body region for controlling a channel region within the body region.

20 Claims, 5 Drawing Sheets

(51) Int. Cl.
*H01L 29/417* (2006.01)
*H01L 29/10* (2006.01)

(56) References Cited

U.S. PATENT DOCUMENTS

| | | | |
|---|---|---|---|
| 6,479,876 B1 | 11/2002 | Deboy et al. | |
| 6,633,064 B2 | 10/2003 | Auerbach et al. | |
| 6,768,170 B2 | 7/2004 | Zhou | |
| 6,828,609 B2 | 12/2004 | Deboy et al. | |
| 7,176,524 B2 | 2/2007 | Loechelt et al. | |
| 7,253,477 B2 | 8/2007 | Loechelt et al. | |
| 7,285,823 B2 | 10/2007 | Loechelt et al. | |
| 7,372,111 B2 | 5/2008 | Onishi et al. | |
| 7,411,266 B2 | 8/2008 | Tu et al. | |
| 7,423,316 B2* | 9/2008 | Kawaji et al. | 257/330 |
| 7,482,220 B2 | 1/2009 | Loechelt et al. | |
| 7,696,600 B2 | 4/2010 | Mauder et al. | |
| 7,902,075 B2 | 3/2011 | Grivna et al. | |
| 7,902,601 B2 | 3/2011 | Loechelt et al. | |
| 7,960,781 B2 | 6/2011 | Loechelt et al. | |
| 7,989,885 B2* | 8/2011 | Hirler et al. | 257/330 |
| 8,106,436 B2 | 1/2012 | Grivna et al. | |
| 8,372,716 B2 | 2/2013 | Loechelt et al. | |
| 8,389,369 B2 | 3/2013 | Loechelt | |
| 2008/0128798 A1 | 6/2008 | Schulze et al. | |
| 2010/0059814 A1* | 3/2010 | Loechelt et al. | 257/330 |
| 2010/0187604 A1 | 7/2010 | Ono et al. | |
| 2010/0317158 A1 | 12/2010 | Yilmaz et al. | |
| 2011/0156682 A1* | 6/2011 | Girdhar et al. | 323/283 |
| 2012/0187527 A1 | 7/2012 | Guitart et al. | |
| 2013/0015493 A1* | 1/2013 | Senoo | H01L 29/7395 257/133 |
| 2014/0048847 A1* | 2/2014 | Yamashita | H01L 29/407 257/140 |

OTHER PUBLICATIONS

Hideharu Egawa, Avalanche Characteristics of Failure Mechanism of High Voltage Diodes, IEEE Xplore, Transactions on Electron Devices, vol. ED-13, Nov. 1966.

Wataru, Saito, et al., A 20mΩcm2 600 V-class Superjunction MOSFET, Proceedings of 2004 International Symposium on Power Semiconductor Devices & ICs, Kitayushu, pp. 459-462.

* cited by examiner ment of a charge balanced semiconductor device that improves Eas performance for an optimum charge balance and/or a selected charge balance window. It would be beneficial if the structure and method maintained the design trade-offs between Eas, Rdson, and BVdss. Additionally, it would beneficial if the structure and method did not add significant process complexity or excessive costs.

SEMICONDUCTOR DEVICE HAVING LOCALIZED CHARGE BALANCE STRUCTURE AND METHOD

CROSS REFERENCE TO RELATED APPLICATION

This application claims the benefit of priority from U.S. Provisional Application No. 61/710,460, which was filed on Oct. 5, 2012 and fully incorporated herein.

BACKGROUND

The present invention relates, in general, to electronics and, more particularly, to methods of forming semiconductors and structures therefore.

Metal-oxide semiconductor field effect transistors (MOSFETs) are a common type of power switching device. A MOSFET device includes a source region, a drain region, a channel region extending between the source and drain regions, and a gate structure provided adjacent to the channel region. The gate structure includes a conductive gate electrode layer disposed adjacent to and separated from the channel region by a thin dielectric layer.

When a MOSFET device is in the on state, a voltage is applied to the gate structure to form a conduction channel region between the source and drain regions, which allows current to flow through the device. In the off state, any voltage applied to the gate structure is sufficiently low so that a conduction channel does not form, and thus current flow does not occur. During the off state, the device must support a high voltage between the source region and the drain region.

Today's higher voltage power switch market is driven by at least two major parameters, which include breakdown voltage (BVdss) and on-state resistance (Rdson). For a specific application, a minimum breakdown voltage is required, and in practice, designers typically can meet a BVdss specification. However, this is often at the expense of Rdson. This trade-off in performance is a major design challenge for manufacturers and users of high voltage power switching devices.

Recently, superjunction devices have gained in popularity to improve the trade-off between Rdson and BVdss. In previous n-channel superjunction devices, multiple heavily-doped diffused n-type and p-type regions replace one lightly doped n-type epitaxial region. In the on state, current flows through the heavily doped n-type regions, which lowers Rdson. In the off or blocking state, the heavily doped n-type and p-type regions deplete into or compensate each other to provide a high BVdss. Although superjunction devices look promising, significant challenges still exist in manufacturing them.

Another problem with previous superjunction devices is that the energy capability (Eas) under unclamped inductive switching (UIS) testing is often too low under optimum charge balance (for example, CB approaching 0%) or within a desired charge balance window. Such inadequate Eas capability is believed to be from low snapback current (Isnapback) in the reverse blocking IdVd curve. A low Isnapback can produce a pure electrical failure observed at few nanoseconds after switching-off the device in the typical UIS test. The electrical failure can occur when a negative differential resistance is reached at a certain region of the active area, thus producing a non-uniform current distribution and, eventually, a current focalization or a "hot spot". Additionally, a low Isnapback can limit the energy capability under other tests, such as reverse recovery tests.

Accordingly, it is desirable to have a structure for and method of making a charge balanced semiconductor device that improves Eas performance for an optimum charge balance and/or a selected charge balance window. It would be beneficial if the structure and method maintained the design trade-offs between Eas, Rdson, and BVdss. Additionally, it would beneficial if the structure and method did not add significant process complexity or excessive costs.

Figure 1:
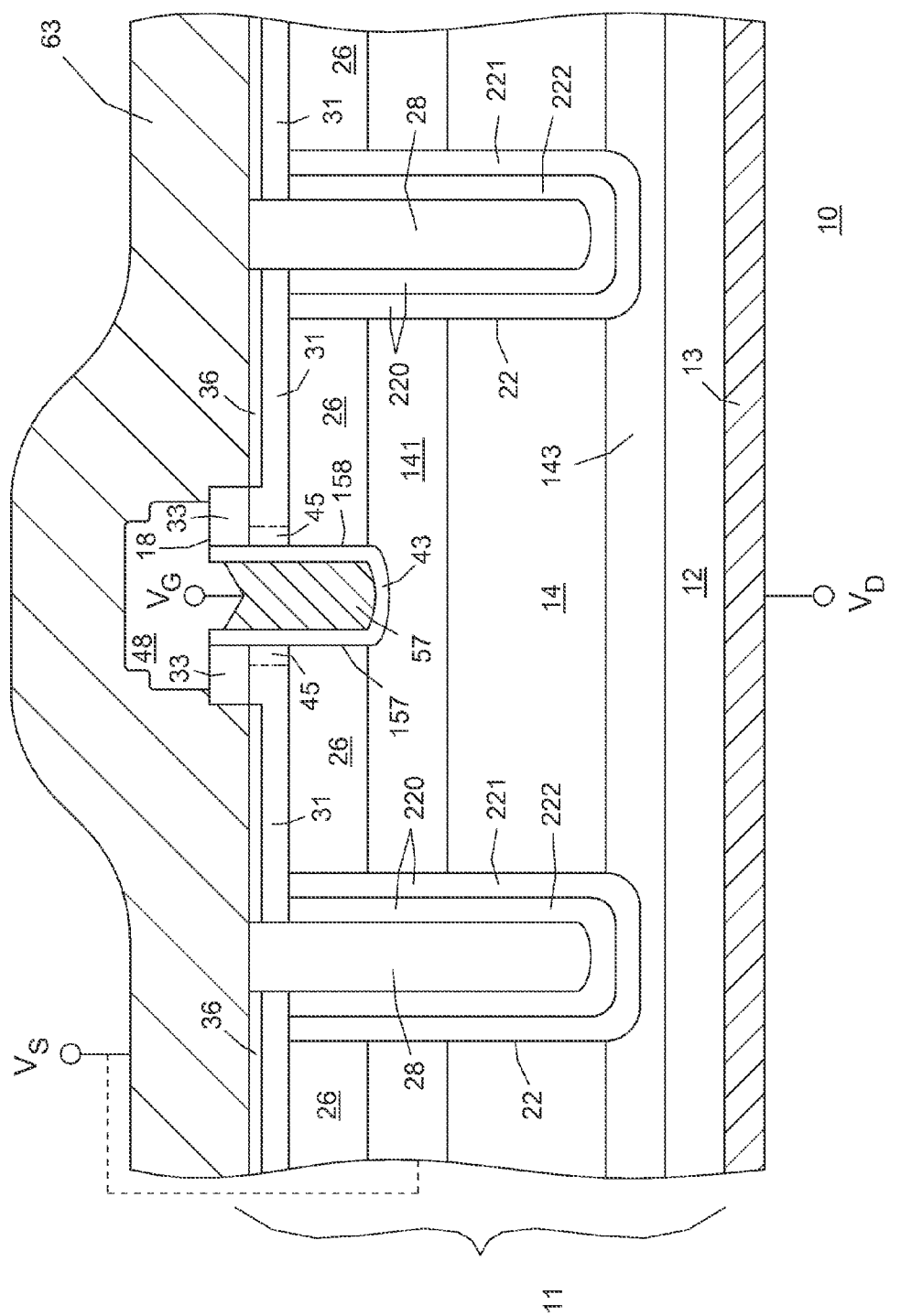
FIG. 1 illustrates a cross-sectional view of an embodiment of a semiconductor device in accordance with the present invention.

For simplicity and clarity of the illustration, elements in the figures are not necessarily drawn to scale, and the same reference numbers in different figures denote the same elements. Additionally, descriptions and details of well-known steps and elements are omitted for simplicity of the description. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

DETAILED DESCRIPTION OF THE DRAWINGS

In accordance with the present description, a local charge balance (LCB) structure is disclosed to overcome, among other things, the Eas problems with previous semiconductor devices. The present embodiment is compatible with current semiconductor device processing methods. In the present embodiment, a thick and low doped p-type region can be formed below an n-type linking region and above the n-type drift region of the LCB device. Advantages of the present embodiments include, but are not limited to, suppression of the Is/Eas well, reduced or no avalanche in the vicinity of the gate trench (which adds to repetitive avalanche ruggedness), and increased breakdown voltage (BVdss) in n-type rich designs. By way of example, the low doped p-type region can be formed using techniques such as epitaxial growth, ion implantation, or other doping techniques as known to those of ordinary skill in the art. The present embodiment is described as an n-channel structure; however, those skilled in the art will appreciate that the present description is suitable for p-channel structures by changing the noted conductivity types from n-type to p-type and vice versa.

Some previous global charge balance (GCB) structures have exhibited unacceptable Eas when the charge balance is less than zero percent (CB<0%). This is explained, at least in part, by considering that when CB<0%, the parasitic bipolar can be more susceptible to being activated. In some devices, the low Eas values have exhibited negligible improvement by increasing the p-type body region and the p+ contact ion implant doses during processing. As a consequence, it is believed that the activation of the parasitic bipolar transistor in GCB structures plays a secondary role in the failure at low Eas.

In addition, certain previous LCB structures have exhibited unacceptably low Eas when CB tends to 0%. This Eas characteristic exhibits a U-shaped curve with the lowest point on the curve located proximate to CB=0%. Note also that CB=0% is generally defined as the point where BVdss approaches a maximum value, which can differ from the CB defined in any given process. It has also been found that there is a correlation between a measured low Eas and simulated Isnapback. A low Isnapback characteristic at CB=0% is believed to be due to the rapid increase of charge density when the LCB device goes into avalanche, which results in negative differential resistance. It has been observed that when CB<0% and CB>0%, a non-rectangular distribution of the electric field in the drift region is believed to avoid such a rapid increase of the charge density. In a conventional GCB structure, a similar Isnapback trend and characteristic has been observed by simulation.

There is a need to elevate the Isnapback level in both GCB and LCB structures. One previous technique used in an attempt to elevate the Isnapback level in planar devices has been to add an n-type buffer layer between the drift region and the n+-substrate. The n-type buffer layer has been shown to increase Eas for CB=0%. In addition, simulations have reproduced similar results by showing an improved Isnapback when the electric field penetrates into the n-type buffer layer. Although the Eas can be boosted about one order of magnitude, the Eas vs. CB curve still suffers an undesirable U-shape effect noted previously. Moreover, Rdson can undesirably increase by 20% with the n-type buffer layer due to the additional series resistance at the end of the drift region, which is undesirable.

FIG. 1 shows a partial cross-sectional view of an insulated gate field effect transistor (IGFET), MOSFET, LCB superjunction device, superjunction structure, charged-compensated, LCB structure, or switching device or cell 10 in accordance with a first embodiment that is configured to address the issues with prior devices described previously. By way of example, device 10 is among many such devices integrated with logic and/or other components into a semiconductor chip as part of a power integrated circuit. Alternatively, device 10 is among many such devices integrated together to form a discrete transistor device.

Device 10 includes a region of semiconductor material 11, which comprises, for example, an n-type silicon substrate 12 having a resistivity in a range of approximately 0.001 to about 0.01 ohm-cm, and may be doped with arsenic or phosphorous. In the embodiment shown, substrate 12 provides a drain region for device 10, which is adjacent to a conductive layer 13. A semiconductor layer 14 is formed in, on, or overlying substrate 12 and is n-type and doped light enough in one embodiment so as to not impact charge balance in the trench compensation regions described below. In one embodiment, layer 14 is formed using epitaxial growth techniques. In an embodiment suitable for a 650 volt device, layer 14 is doped n-type with a dopant concentration of about $1.0 \times 10^{13}$ atoms/$cm^3$ to about $50 \times 10^{14}$ atoms/$cm^3$, and has a thickness on the order of about 40 microns to about 70 microns. Note that although semiconductor layer 14 is shown as thicker than substrate 12 in the drawings, substrate 12 actually can be thicker. It is shown this way for ease of understanding in the drawings. The thickness of layer 14 is increased or decreased depending on the desired BVdss rating of device 10. Additionally, those skilled in the art will understand that an insulated gate bipolar transistor (IGBT) device is achieved with the present structure by, for example, changing the conductivity type of substrate 12 to p-type (i.e., opposite to semiconductor layer 14).

In accordance with the present embodiment, device 10 further includes a semiconductor layer 141 (also referred to a "p-type layer" or a "buried p-type layer" when device 10 is an n-channel device) formed in or within a portion of semiconductor layer 14. As illustrated in FIG. 1, semiconductor layer 141 is spaced apart or separated from major surface by other or intervening regions in the finished device 10. In one embodiment, semiconductor layer 141 is doped p-type with a dopant concentration of about $1.0 \times 10^{15}$ atoms/$cm^3$ to about $4.0 \times 10^{15}$ atoms/$cm^3$. In another embodiment, semiconductor layer 141 has a dopant concentration from about $1.5 \times 10^{15}$ atoms/$cm^3$ to about $2.5 \times 10^{15}$ atoms/$cm^3$. It was found that these doping levels are sufficiently low so as to not impact the channel properties of device 10. In one embodiment, semiconductor layer 141 has a thickness of about 10 microns and can be formed using techniques such as epitaxial growth techniques, which forms an as-doped region. In an alternative embodiment, semiconductor layer 141 can be formed by ion implanting (for example, a p-type implant) after a portion of semiconductor layer 14 is formed and before growing the remaining portion of semiconductor layer 14. Such an implant can be performed using, for example, blanket implant conditions, through one of the existing mask layers (for example, the mask layer used to form body region 31 described later) or with a dedicated mask. As in the epitaxial growth approach in forming semiconductor layer 141, the blanket implant can place semiconductor layer 141 in the termination region and can support the implementation of predetermined termination structures. Using a mask to reduce the presence of semiconductor layer 141 in the termination region of device 10 makes the present embodiment further compatible with other existing termination designs, which is helpful for cost effective integration. A dedicated mask defining a certain distance from semiconductor layer 141 to the N-pillar (i.e., layer 221 described below) can be used to effectively reduce the Rdson impact in the present embodiment.

Device 10 further includes spaced apart filled trenches, compensating trenches, semiconductor material filled trenches, charge-compensated trench regions, LCB regions, LCB structures, charge-compensated filled trenches, compensation trenches, localized vertical charge compensation structures, or LCB regions or pillars 22. As used herein, charge compensation generally means that the total charge of the opposite conductivity type layers is substantially or generally balanced or equal. Charge-compensated filled trenches 22 include a plurality of layers or multiple pillars of material, conductive material or semiconductor material 220, including at least two layers or pillars of opposite conductivity type (i.e., at least one each of n-type and p-type), which may be separated by an intrinsic, buffer, or lightly doped semiconductor layer or layers. As shown in FIG. 1, material 220 includes a pillar or layer 221 of n-type semiconductor material adjoining semiconductor layer 14 and semiconductor layer 141 along sidewall surfaces of trenches 22.

In accordance with a one embodiment, layers 221 are of the same conductivity type as source regions 33, and form a primary vertical low resistance current path from the channel to the drain when device 10 is in the on-state. A layer 222 of compensating p-type semiconductor material is formed overlying or overlies layer 221. By way of example, n-type layers 221 and p-type layers 222 have a dopant concentration on the order of about $1.0 \times 10^{15}$ to about $1.0 \times 10^{17}$ atoms/cm$^3$, and each has a thickness of about 0.1 microns to about 0.4 microns. Depending on the desired charge balance, the foregoing dopant concentrations are increased or decreased accordingly. When device 10 is an off state, p-type layers 222 and n-type layers 221 compensate each other to provide an increased BVdss characteristic. Although no buffer layers are shown in the device of FIG. 1, it is understood that they may be present in earlier steps in fabrication and may not be as evident because dopant can diffuse into such layers during subsequent high temperature processing. In one embodiment, layers of semiconductor material 220 comprise a single crystalline semiconductor material and have as-formed dopant profiles.

In one embodiment, device 10 also includes one or more dielectric layers, dielectric structure, or dielectric plug 28 formed overlying pillars 220 within trenches 22. In one embodiment, dielectric layer 28 is a deposited silicon oxide layer. It is understood that dielectric layer 28 can be more than one dielectric layer and can be different materials. Although not shown, it is understood that during the formation of device 10, n-type dopant from highly doped substrate 12 can diffuse into the lower portions of charge-compensated trenches 22 so that those portions of trenches 22 within substrate 12 become more heavily doped n-type.

Device 10 also includes a well, base, body or doped regions 31 formed in semiconductor layer 141 between and in proximity to, adjacent to, or adjoining charge-compensated trenches 22. Body regions 31 extend from major surface 18 of semiconductor material 11. In one embodiment, body regions 31 comprise p-type conductivity, and have a dopant concentration suitable for forming an inversion layer that operates as conduction channels 45 of device 10. Body regions 31 extend from major surface 18 to a depth of about 1.0 to about 5.0 microns. As stated above, body regions 31 can be a plurality of individually diffused regions or can be a connected, single or commonly diffused region of selected shape, or combinations thereof.

N-type source regions 33 are formed within, above, or in body regions 31 and extend from major surface 18 to a depth of about 0.2 microns to about 0.5 microns. In the embodiment shown, portions of major surface 18 extend down and then outward from the edges of source regions 33 so that contact is made to horizontal and vertical surfaces of source regions 33 by source contact layer 63. One or more p-type body contact regions 36 are formed in at least a portion of each body region 31. Body contact regions 36 are configured to provide a lower contact resistance to body region 31, and to lower the sheet resistance of body regions 31 under source regions 33, which suppresses parasitic bipolar effects.

Device 10 further includes a trench gate or control structure 157 adjoining body regions 31 and source regions 33. Control structure 157 is laterally spaced apart from adjacent charge-compensated trenches 22. That is, control structure 157 does not overlie charge-compensated trenches 22. Trench gate structure 157 includes a gate trench 158 and a gate dielectric layer 43 formed overlying surfaces of gate trench 158. In one embodiment, gate dielectric layer 43 comprises a silicon oxide, and has a thickness of about 0.05 microns to about 0.1 microns. In another embodiment, gate dielectric layer 43 has a thickness at the lower surfaces of gate trench 158 that is greater or thicker than the thickness of gate dielectric layer 43 along the sidewalls of gate trench 158. In alternative embodiments, gate dielectric layer 43 comprises silicon nitride, tantalum pentoxide, titanium dioxide, barium strontium titanate, or combinations thereof including combinations with silicon oxide, or the like.

Trench gate structure 157 further includes a conductive gate region 57 formed within control or gate trench 158 and overlies gate dielectric layer 43. In one embodiment, a source region 33 is interposed between a conductive gate region 57 and a charge compensation trench 22. Conductive gate region 57 comprises, for example, n-type polysilicon. Although conductive gate region 57 is shown as recessed below major surface 18, conductive gate region 57 may extend higher or above major surface 18. Trench gate structure 157 is configured to control the formation of channels 45 and the conduction of current in device 10.

To facilitate a sub-surface current path, device 10 further includes n-type link, n-type doped doped layers or sub-surface doped layers 26. Specifically, doped layers 26 are configured to provide a sub-surface conduction path between the drain end of channels 45 and n-type layers 221, which are the primary conduction layers or vertical conduction paths in charge compensation trenches 22. That is, in device 10 current flows vertically through channels 45, then horizontally through doped layers 26, and then vertically through layers 221. Doped layers 26 are configured so that current flow is isolated from major surface 18 by body regions 31 and body contact regions 36, which are opposite conductivity types (p-type) from doped layers 26 (n-type). This isolation feature keeps the conduction path away from defect regions near the surface thereby avoiding any conduction related problems.

Device 10 further includes an interlayer dielectric region 48 formed on or above major surface 18, which is patterned to provide openings to body contact regions 36 and source regions 33. A portion of interlayer dielectric region 48 is left overlying trench gate structure 157 to provide isolation for conductive gate region 57. Interlayer dielectric region 48 comprises for example, a silicon oxide such as a deposited oxide, and has a thickness from about 0.4 microns to about 1.0 microns. It is understood that contact can be made to conductive gate region 57 on another portion of device 10 (not shown).

Source contact layer 63 is formed on or above major surface 18 and makes contact to both source regions 33 and body contact regions 36. In one embodiment, source contact layer 63 comprises a titanium/titanium nitride barrier layer and an aluminum silicon alloy formed overlying the barrier layer, or the like. Drain contact layer 13 is formed overlying an opposing surface of semiconductor material 11, and comprises, for example, a solderable metal structure such as titanium-nickel-silver, chrome-nickel-gold, or the like. Device 10 is further illustrated with an optional n-type buffer layer 143, which will be described in another embodiment subsequently.

The operation of device 10 proceeds as follows. Assume that source terminal 63 is operating at a potential $V_S$ of zero volts, conductive gate regions 157 receive a control voltage $V_G$=5.0 volts, which is greater than the conduction threshold of device 10, and drain terminal 13 operates at drain potential $V_D$=5.0 volts. The values of $V_G$ and $V_S$ cause body region 31 to invert adjacent conductive gate regions 157 to form vertical channels 45, which electrically connect source regions 33 to doped regions 26. A device current Id flows from drain terminal 13 and is routed through n-type pillars 221, doped layer 26, channels 45, source regions 33, to source terminal 63. Hence, current Id flows vertically through n-type pillars 221 to produce a low on-resistance, and horizontally through n-type links 26 keeping the current path isolated from major surface 18. In one embodiment, Id=1.0 amperes. To switch device 10 to the off state, a control voltage $V_G$ of less than the conduction threshold of the device is applied to conductive gate regions 157 (e.g., $V_G$<5.0 volts). This removes channels 45 and Id no longer flows through device 10. In the off state, n-type pillars 221 and p-type pillars 222 compensate each other as the depletion region from the primary blocking junction spreads, which enhances BVdss.

Figure 2:
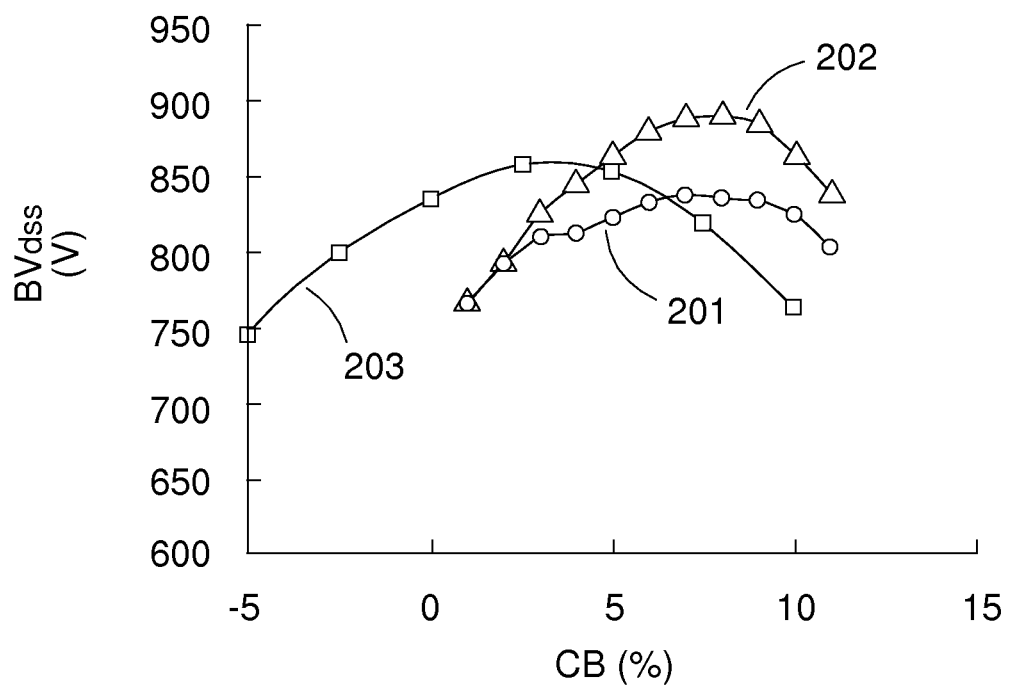
FIG. 2 illustrates graphical information of breakdown voltage (BVdss) vs. charge balance (CB) comparing an embodiment of the present invention to previous structures.
Figure 3:
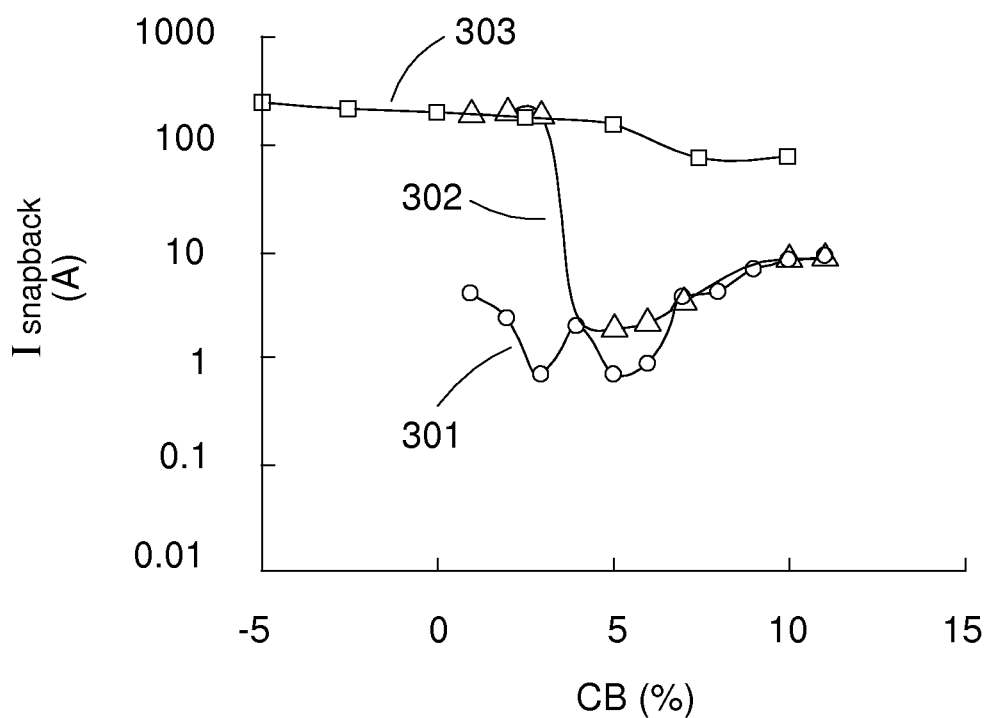
FIG. 3 illustrates graphical information of snapback current (Isnapback) vs. CB comparing an embodiment of the present invention with previous structures.

The benefits of p-type semiconductor layer 141 in the present embodiment are further illustrated in FIGS. 2 and 3. FIG. 2 illustrates BVdss (V) as a function of charge balance percentage (CB %) where curve 201 represents a prior device without an n-type buffer below the n-type drift region, curve 202 represents a prior structure with an n-type buffer below the n-type drift region, and curve 203 represent the present embodiment with p-type semiconductor layer 141 without an n-type buffer layer below the n-type drift region. FIG. 3 illustrates Isnapback (A) as a function of charge balance percentage (CB %) where curve 301 represents a prior device without an n-type buffer, curve 302 represents a prior structure with an n-type buffer, and curve 303 represent the present embodiment with p-type semiconductor layer 141. This data illustrates, for example, that in the present embodiment the Isnapback U-shape is reduced, and Isnapback is shifted above about 50 amps (A) including for a charge balanced structure (i.e., CB=0%).

Figure 4:
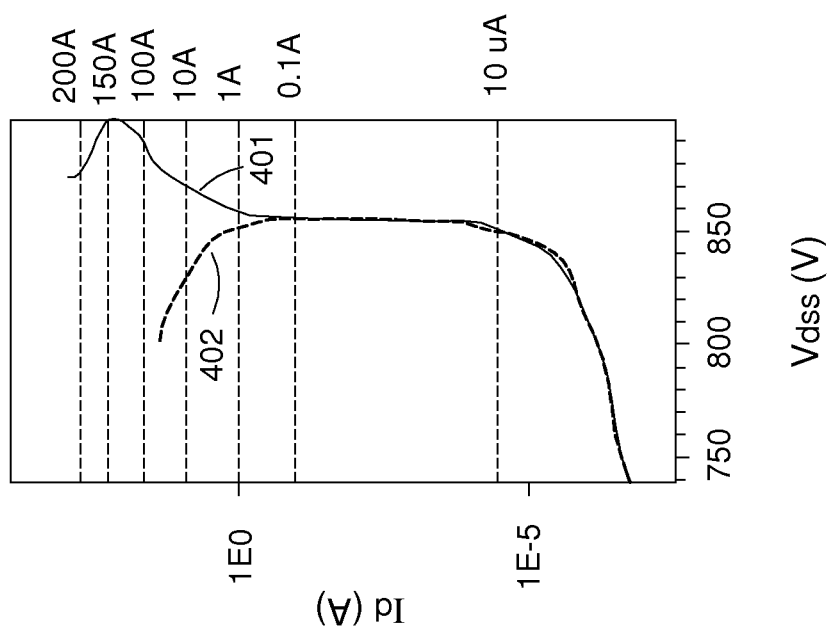
FIG. 4 illustrates graphical information of reverse mode drain current (Id) and drain-to-source voltage (Vdss) curves extracted at CB=5% comparing an embodiment of the present invention to a prior structure.

FIG. 4 illustrates graphical information of drain current (Id) vs. breakdown voltage (BVdss) comparing device 10 (curve 401) with a CB of 5% to a prior structure (curve 402) that does not include p-type semiconductor layer 141. As illustrated in FIG. 4, device 10 exhibits improved Isnapback performance.

Figure 5:
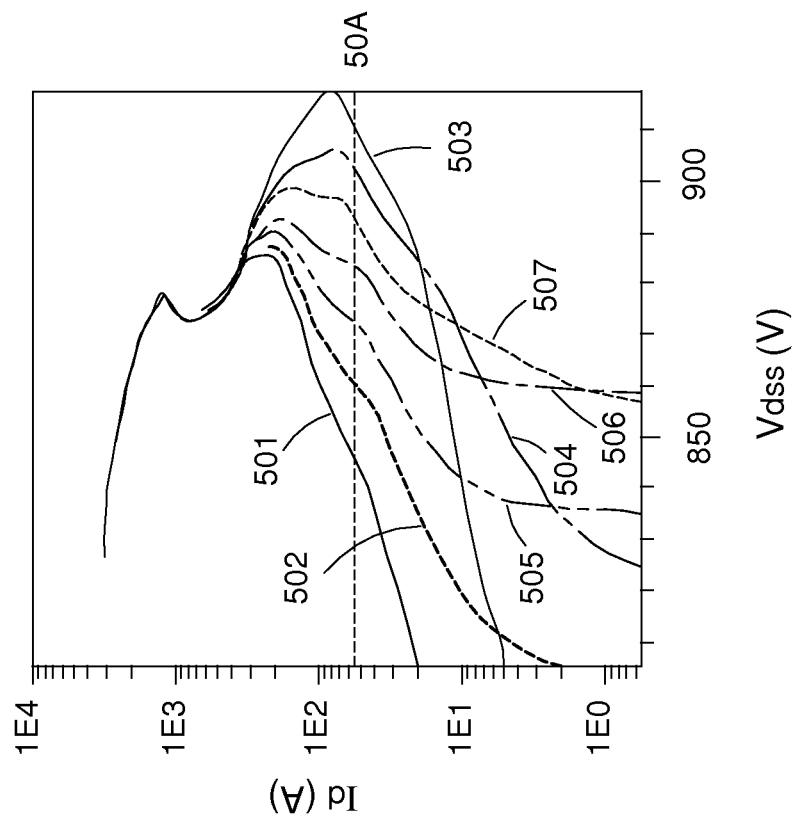
FIG. 5 illustrates graphical information of reverse mode IdVdss curves extracted at different CB levels in a structure in accordance with the present invention.

FIG. 5 illustrates graphical information of example Id-Vd curves for device 10 of the present embodiment generated using simulations under isothermal conditions. Curve 501 corresponds to a CB of −5%; curve 502 corresponds to a CB of −2.5%; curve 503 corresponds to a CB of 10%; curve 504 corresponds to a CB of 7.5%; curve 505 corresponds to a CB of 0%; curve 506 corresponds to a CB of 2.5%; and curve 507 corresponds to a CB of 5%. An explanation of the physical mechanisms for the higher Isnapback in accordance with the present embodiment is provided subsequently. In the present embodiment, the BVdss is believed to be enhanced due to a more optimum electric field distribution towards the top or upper surface of device 10 that adds ruggedness during avalanche cycling tests. In accordance with the present embodiment, avalanche occurs deeper into the semiconductor material because of the presence of semiconductor layer 141.

Thus, the degradation after multiple UIS cycles (or other tests that induce avalanche) is less compared to previous structures where the avalanche takes place close to the interface between p-type pillars 222 and dielectric plug 28. It was also observed in the present embodiment that the impact ionization distribution tends to follow the electric field distribution.

In the present embodiment, the targeted Rdson can be dependent upon the characteristics of semiconductor layer 141 and the fabrication method used to form this region of device 10. In one embodiment, an Rdson degradation ranging from 5% to 20% was found in simulated structures. However, the present embodiment was found to be a more robust device compared to a device with only an n-type buffer for a similar Rdson. There are believed to be at least two elements that may impact Rdson in the present embodiment. With a minor impact, semiconductor layer 141 may block the current conduction through the lighter doped semiconductor layer 14. Because most of the current flows through n-type pillars 221, this may be less of a concern for LCB devices (but it would be more of a concern for GCB or planar devices). Additionally, the enhanced JFET effect at the n-type link 26 and n-type pillar 221 region can have a greater impact for Rdson measured at a high drain voltage. In other embodiments, these results can be improved by optimizing (for example, dopant levels or dopant profiles) the n-type link 26 and n-type pillar 221 structures.

It was observed that at a drain current (Id) of 10 amps, the electric field decrement at semiconductor layer 14 can be compensated by the electric field increment at semiconductor layer 141, thus generating a positive differential resistance. In the baseline structure with the non-optimized n-type buffer layer, the negative differential resistance occurs for I<10 A due to a reduction of electric field in the drift region. The presence of semiconductor layer 141 enables Isnapback>50 A for the complete CB range as illustrated in FIG. 5; however when semiconductor layer 141 is combined with the addition of an n-type buffer (represented by layer 143 in FIG. 1), Isnapback can be even larger and the electric field can be extended to the n-type buffer layer for I>100 A.

Figure 6:
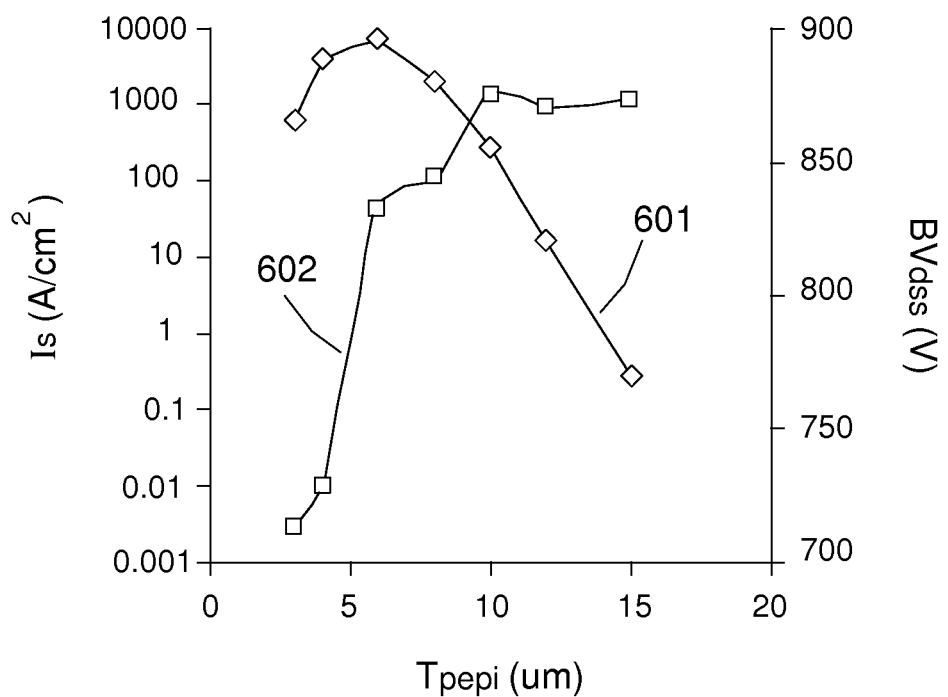
FIG. 6 illustrates graphical information of Isnapback and BVdss versus thickness of a structure in accordance with an embodiment of the present invention.
Figure 7:
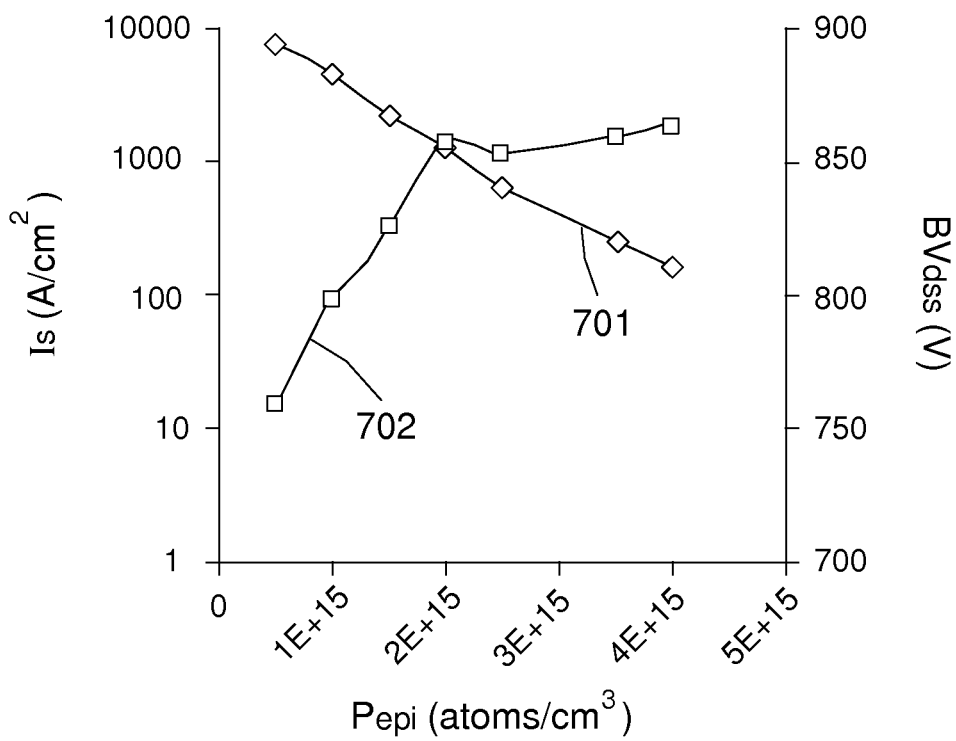
FIG. 7 illustrates graphical information of Isnapback and BVdss versus dopant concentration of a structure in accordance with an embodiment of the present invention.

The present embodiment can be implemented by different manufacturing methods. As described previously, in one embodiment the last portion (for example, about 10 microns) of semiconductor layer 14 is replaced by semiconductor layer 141 doped with boron. In one embodiment, the presence of semiconductor layer 141 provides an improvement after analyzing the BVdss and Isnapback dependencies with the thickness of semiconductor layer 141 (Tpepi) and the dopant concentration (Pepi) thereof as illustrated respectively in FIGS. 6 and 7. Curves 601 and 701 represent breakdown voltage in FIGS. 6 and 7 respectively, and curves 602 and 702 represent Isnapback respectively. It was observed, for example, that if Tpepi and Pepi are too low then an Isnapback reduction of orders of magnitude can result. If Tpepi and Pepi are too high a degradation of BVdss can occur.

Figure 8:
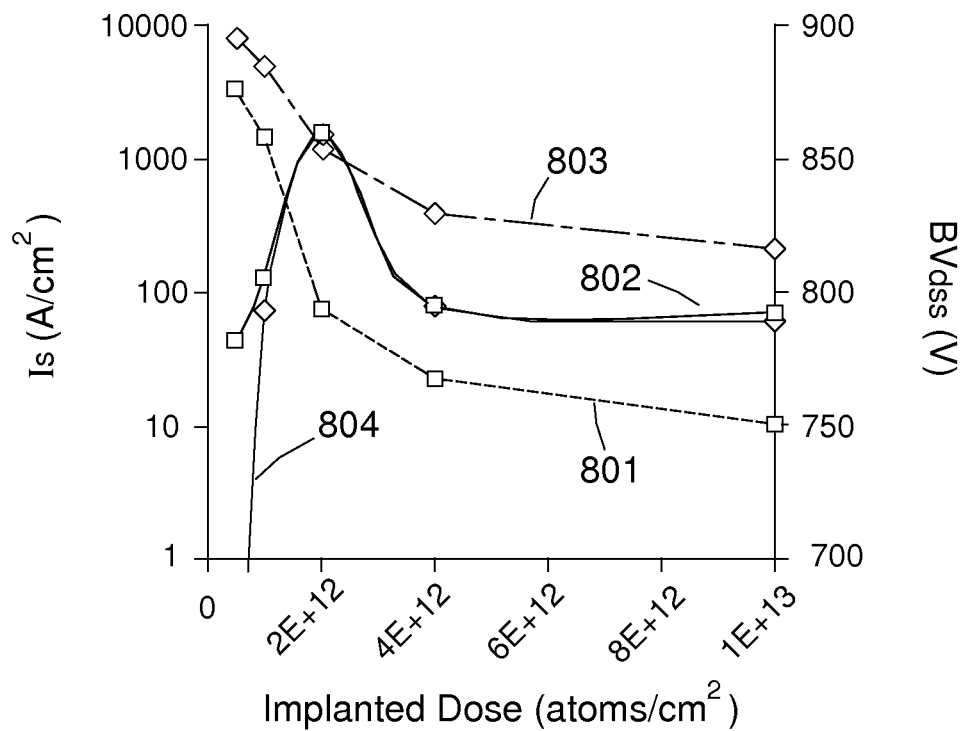
FIG. 8 illustrates graphical information of Isnapback and BVdss versus ion-implant dose and dose location in accordance in accordance with another embodiment of the present invention.

An alternative method to implement the present embodiment is to perform an ion implantation (for example, p-type implantation when device 10 is an n-channel device) before growing the final portion of semiconductor layer 14. FIG. 8 illustrates that the ion implantation method provides similar results to the epitaxial growth method. Curves 801 and 802 represent breakdown voltage and snapback current respectively for a p-type implant done before growing a final 10 microns of n-type semiconductor layer 14; and curves 803 and 804 represent breakdown voltage and snapback current respectively before growing the final 6 microns of n-type semiconductor layer 14.

Further studies of device 10 showed that incorporating semiconductor layer 141 resulted in only a minor impact on electrical performance compared to a previous structure without such a layer in Rdson performance. However, total gate charge (Qg) and capacitances were not degraded in device 10. Also, device 10 was found to exhibit similar efficiency compared to the previous structure in a typical boost converter application, which was further verified by mixed-mode simulations.

Figure 9:
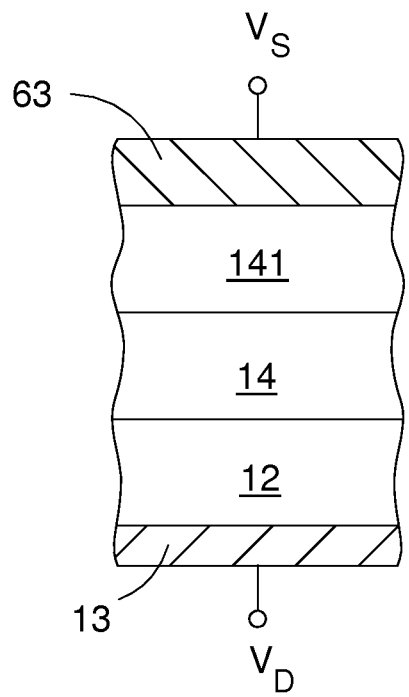
FIG. 9 illustrates a partial cross-sectional view of a further embodiment of a structure in accordance with the present invention.

In one embodiment, due to the low doping concentration of semiconductor layer 141, the activation of the parasitic bipolar transistor formed between n-type link 26, p-type semiconductor layer 141, and n-type semiconductor layer 14 (Nlink-Pepi-Nepi) can be reduced or avoided. A variation of the present embodiment includes electrically connecting semiconductor layer 141 to source contact layer 63 on another portion of device 10, which is generally illustrated in FIG. 9 and further illustrated by the dashed connective line between the Vs terminal in FIG. 1 and semiconductor layer 141. In this configuration, it was observed that the BVdss is similar (about 15 volts less for the source connected to semiconductor layer 141 embodiment) while Isnapback increased due to the grounded bipolar base region (i.e., semiconductor layer 141) by about 2×. This embodiment was simulated in a boost converter (for example, 90V to 400V) by mixed-mode simulations and showed similar efficiency compared previous structures that did not have semiconductor layer 141 in accordance with (for example, same turn-off and turn-on times).

In view of all of the above, it is evident that a novel structure and method are disclosed. Included, among other features, is forming a low-doped p-type region adjoining a vertical super-junction structure. In one embodiment, the low-doped p-type region is formed below an n-type linking and above a low doped n-type region. The low-doped p-type region is configured, among other things, to improve Eas performance without significantly impacting other performance parameters. In another embodiment, the conductivity types can be reversed.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

We claim:

1. A semiconductor device comprising:
a semiconductor substrate defining a major surface;
a first region comprising at least a first pillar of a first conductivity type, and a second pillar of a second conductivity type extending in a generally vertical orientation with respect to the major surface, wherein the first conductivity type is opposite to the second conductivity type, and wherein the first pillar is configured as a vertical current path;
a second region of the first conductivity type spaced apart from the major surface and adjoining a lower portion of the first region;
a third region of the second conductivity type adjoining the first region between the major surface and the second region;
a body region of the second conductivity type between a portion of the third region and the major surface;
a source region of the first conductivity type adjoining the body region; and
a control electrode adjoining the body region and the source region and configured to control a channel region within the body region but not within the third region.

2. The device of claim 1 further comprising a fourth region of the first conductivity type between the body region and the third region and configured to link a drain end of the channel region to the first region.

3. The device of claim 1, wherein the third region has a dopant concentration in a range from about $1.0 \times 10^{15}$ atoms/cm$^3$ to about $4.0 \times 10^{15}$ atoms/cm$^3$, and wherein the first region has a charge balance other than zero.

4. The device of claim 1, wherein the third region has a dopant concentration in a range from about $1.0 \times 10^{15}$ atoms/cm$^3$ to about $3.0 \times 10^{15}$ atoms/cm$^3$.

5. The device of claim 1, wherein the first pillar of the first conductivity type adjoins the second and third regions.

6. The device of claim 1, wherein the control electrode comprises a trench control electrode, and wherein the third region overlaps the trench control electrode and the trench control electrode terminates within the third region.

7. The device of claim 1 further comprising a conductive layer electrically connected to the source region and the third region.

8. A semiconductor device comprising:
a substrate;
a semiconductor layer overlying the substrate, wherein the semiconductor layer has a major surface spaced apart from the substrate;
a vertically-oriented charge balance region adjacent to the major surface and extending towards the substrate;
a body region of a first conductivity type adjacent to another portion of the major surface;
a first horizontally-oriented doped region of a second conductivity type spaced apart from the major surface and between the body region and the substrate, wherein the first horizontally-oriented doped region adjoins the vertically-oriented charge balance region;
a second horizontally-oriented doped region of the first conductivity type spaced apart from the major surface and between the first horizontally-oriented doped region and the substrate; and
a gate electrode electrically insulated from the body region and the first horizontally-oriented doped region,
wherein:
a transistor structure of the semiconductor device comprises the first horizontally-oriented doped region, the body region, and the gate electrode;
the second horizontally-oriented doped region is configured to shift avalanche regions away from the gate electrode and from upper portions of the vertically-oriented charge balance structure towards the semiconductor layer; and
the vertically-oriented charge balance structure electrically connects the transistor structure and the substrate to each other.

9. The structure of claim 8, wherein the second horizontally-oriented doped region has a dopant concentration in range from about $1.0 \times 10^{15}$ atoms/cm$^3$ to about $4.0 \times 10^{15}$ atoms/cm$^3$.

10. The structure of claim 8, wherein the second horizontally-oriented doped region has a dopant concentration between about $1.0 \times 10^{15}$ atoms/cm$^3$ to about $3.0 \times 10^{15}$ atoms/cm$^3$.

11. The structure of claim 8, wherein the second horizontally-oriented doped region has a thickness from about five microns to about fifteen microns.

12. The structure of claim 8, wherein the gate electrode comprises a trench gate electrode, and wherein the second horizontally-oriented doped region overlaps the gate electrode and the gate electrode terminates within the second horizontally-oriented doped region.

13. The structure of claim 8, wherein the vertically-oriented charge balance region comprises a plurality of first conductivity type and second conductivity type pillars.

14. The structure of claim 8 further comprising a source region formed in the body region and a conductive layer electrically connected to the source region and the second horizontally-oriented doped region.

15. A semiconductor device comprising:
a semiconductor substrate defining a major surface;
a first region comprising at least a first pillar of a first conductivity type, wherein the first pillar is configured as a vertical current path;
a body region of a second conductivity type opposite to the first conductivity type adjacent the major surface;
a source region of the first conductivity type adjoining the body region;
a second region of the first conductivity type spaced apart from the major surface and adjoining a lower portion of the first region;
a third region of the second conductivity type adjoining the first region between the major surface and the second region;
a control electrode adjoining the body region and the source region and configured to control a channel region within the body region but not within the third region; and
a fourth region of the first conductivity type between the body region and the third region and configured to provide a generally horizontal current path between a drain end of the channel region and the first region.

16. The device of claim 15, wherein:
the first region further comprises a second pillar of a second conductivity type extending in a generally vertical orientation with respect to the major surface; and
the third region is configured to enhance electrical field distribution during an avalanche condition.

17. The device of claim 16, wherein the first region has a charge balance greater than zero percent and less than about ten percent, and wherein the third region has a thickness in range from about five microns to about fifteen microns.

18. The device of claim 16, wherein the first region has charge balance greater than negative five percent and less than zero percent.

19. The device of claim 15 further comprising a conductive layer electrically connected to the source region and the third region.

20. The device of claim 15, wherein the control electrode comprises a trench control electrode extending into the semiconductor substrate, and wherein the third region overlaps the control electrode such that the control electrode terminates within the third region, and wherein the device further comprises a buffer layer, wherein the second region is between the buffer layer and the third region.

* * * * *